US012563671B2

(12) United States Patent
Krick

(10) Patent No.: US 12,563,671 B2
(45) Date of Patent: Feb. 24, 2026

(54) LIGHT SOURCE SUPPORT ASSEMBLY

(71) Applicant: VALEO VISION, Bobigny (FR)

(72) Inventor: Sebastian Krick, Bobigny (FR)

(73) Assignee: VALEO VISION, Bobigny (FR)

( * ) Notice: Subject to any disclaimer, the term of this patent is extended or adjusted under 35 U.S.C. 154(b) by 210 days.

(21) Appl. No.: 18/257,405

(22) PCT Filed: Dec. 8, 2021

(86) PCT No.: PCT/EP2021/084861
§ 371 (c)(1),
(2) Date: Jun. 14, 2023

(87) PCT Pub. No.: WO2022/128698
PCT Pub. Date: Jun. 23, 2022

(65) Prior Publication Data
US 2024/0107672 A1 Mar. 28, 2024

(30) Foreign Application Priority Data

Dec. 16, 2020 (FR) ...................................... 20 13381

(51) Int. Cl.
| | |
|---|---|
| *H05K 1/14* | (2006.01) |
| *F21S 41/153* | (2018.01) |
| *F21V 23/00* | (2015.01) |
| *H05K 1/02* | (2006.01) |
| *H05K 1/181* | (2026.01) |

(52) U.S. Cl.
CPC ............ *H05K 1/148* (2013.01); *F21S 41/153* (2018.01); *F21V 23/005* (2013.01); *H05K 1/0204* (2013.01); *H05K 1/181* (2013.01); *H05K 2201/042* (2013.01); *H05K 2201/09972* (2013.01); *H05K 2201/10106* (2013.01)

(58) Field of Classification Search
CPC ...................................................... H05K 1/148
USPC ......................................................... 361/749
See application file for complete search history.

(56) References Cited

U.S. PATENT DOCUMENTS

2014/0168899 A1    6/2014   Chang
2020/0014893 A1*   1/2020   Li ........................ H04N 9/3144

FOREIGN PATENT DOCUMENTS

DE    20 2004 003 793        * 11/2000
DE    20 2004 003 793 U1      5/2004
(Continued)

OTHER PUBLICATIONS

International Search Report issued Mar. 10, 2022 in PCT/EP2021/084861 filed on Dec. 8, 2021, 2 pages.

*Primary Examiner* — Stanley Tso
(74) *Attorney, Agent, or Firm* — Oblon, McClelland, Maier & Neustadt, L.L.P.

(57) ABSTRACT

A light source support assembly for an automotive vehicle, the light source support assembly includes at least two rigid Printed Circuit Board (PCB) parts having a first rigid PCB part and a second rigid PCB part. The first rigid PCB part is mounted with a plurality of first components that are heat generating components and the second rigid PCB part is mounted with a plurality of second components that are components not generating heat or components generating less heat compared to the plurality of first components. A flexible connecting part interconnecting the first rigid PCB part and the second rigid PCB part, and includes at least one bendable portion configured to bend the light source support assembly.

15 Claims, 5 Drawing Sheets

(56) References Cited

FOREIGN PATENT DOCUMENTS

DE      10 2018 222 746      * 12/2018
DE      10 2018 222 746  A1      6/2020

* cited by examiner

[Fig. 1a]
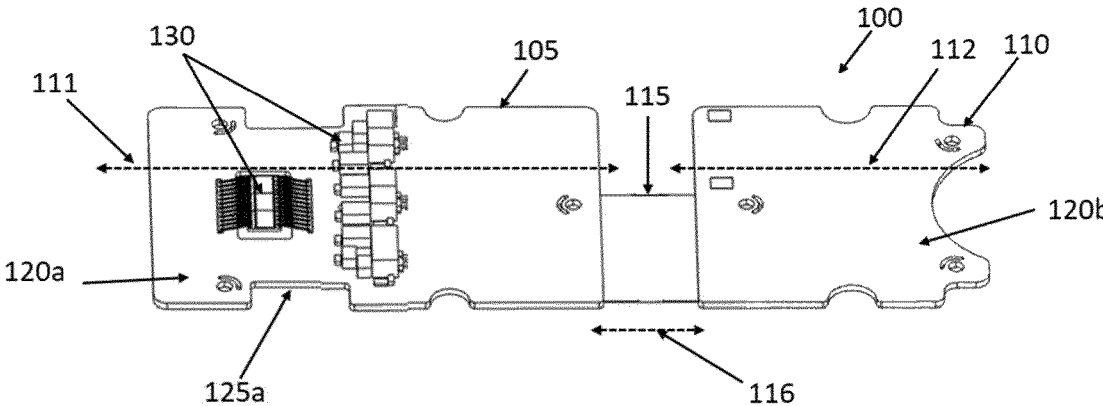
[Fig. 1b]
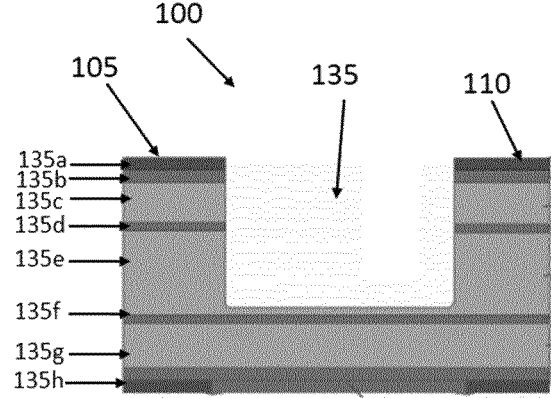
[Fig.1c]
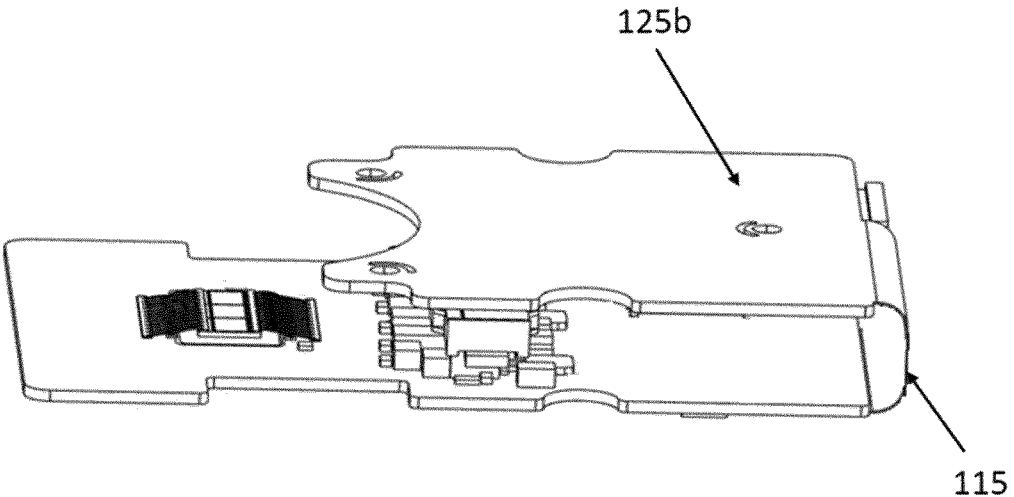

[Fig.2a]
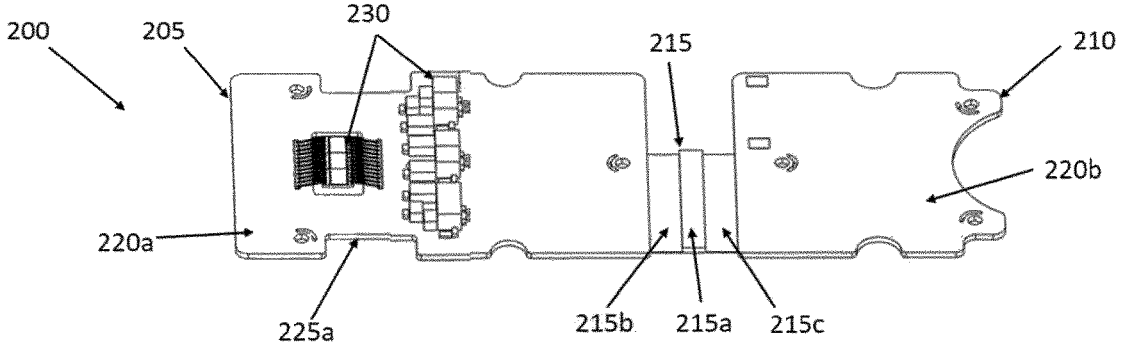
[Fig.2b]
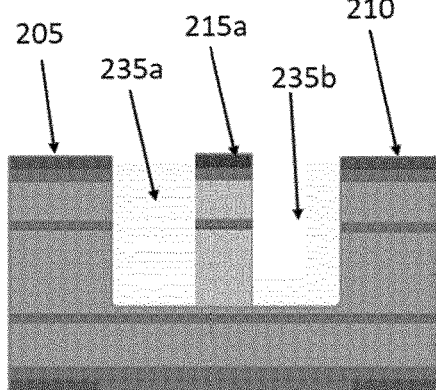
[Fig.2c]
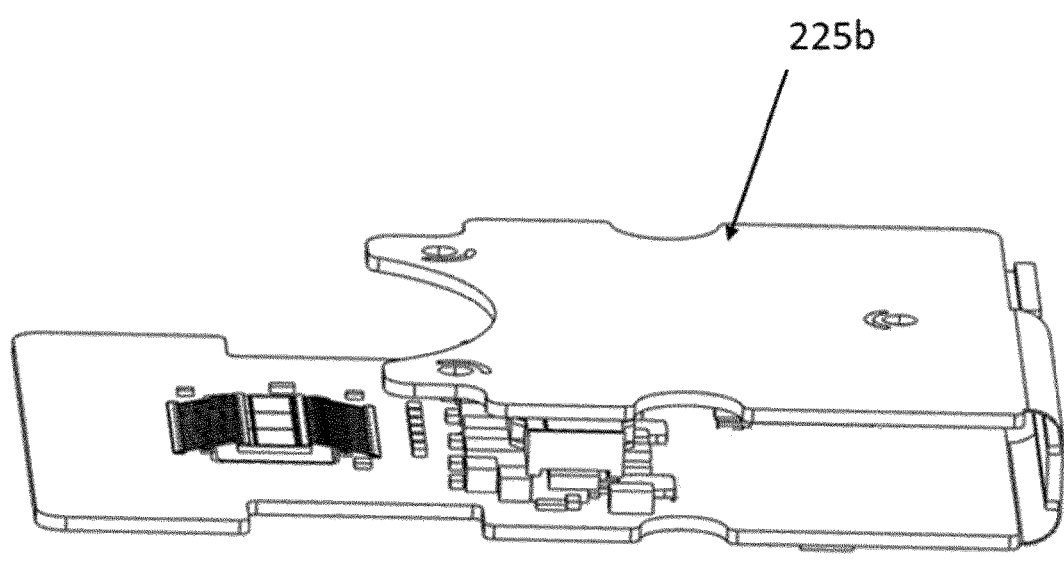

[Fig.3a]
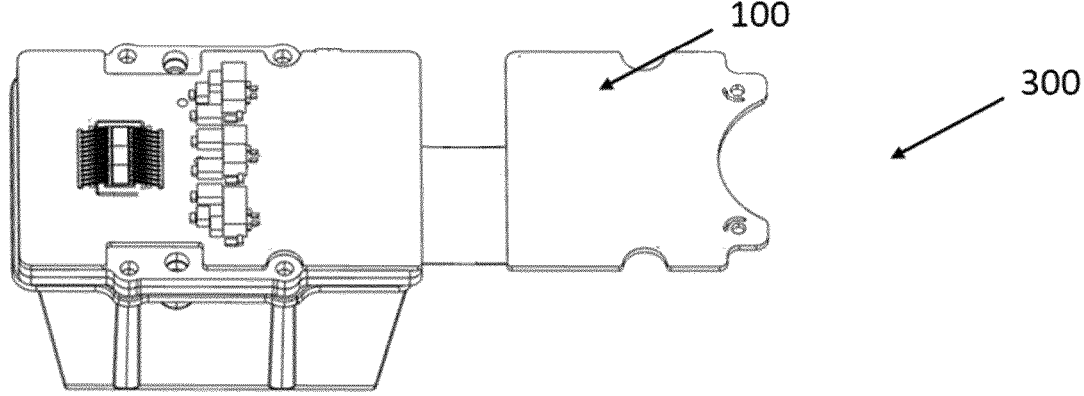
100
300
[Fig.3b]
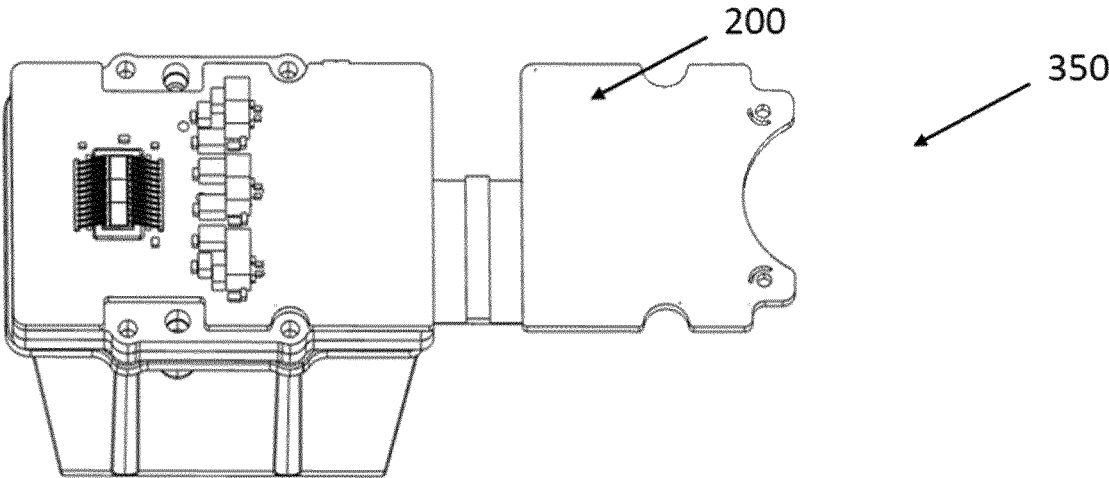
200
350

[Fig.4a]
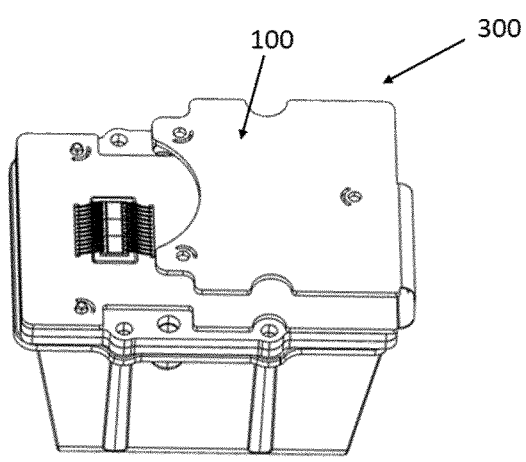
[Fig.4b]
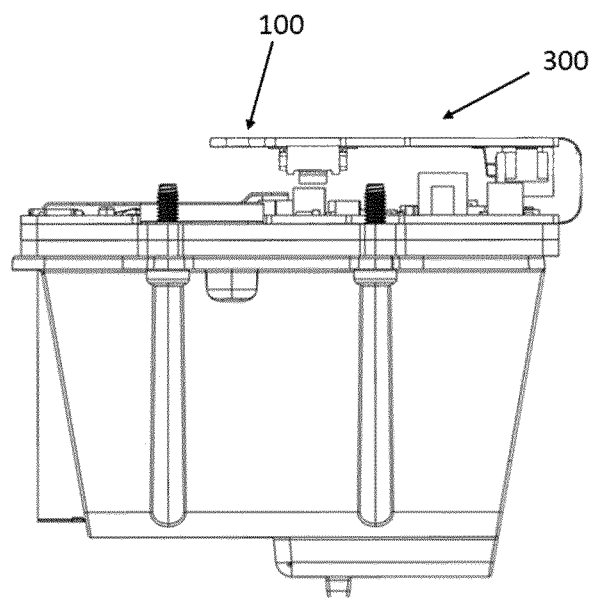

[Fig.5a]
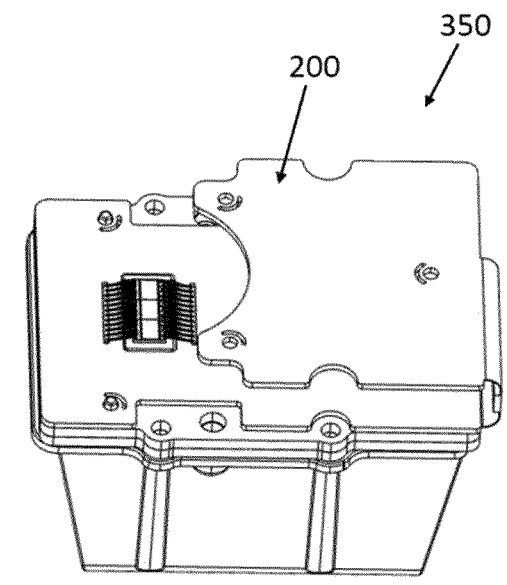
[Fig.5b]
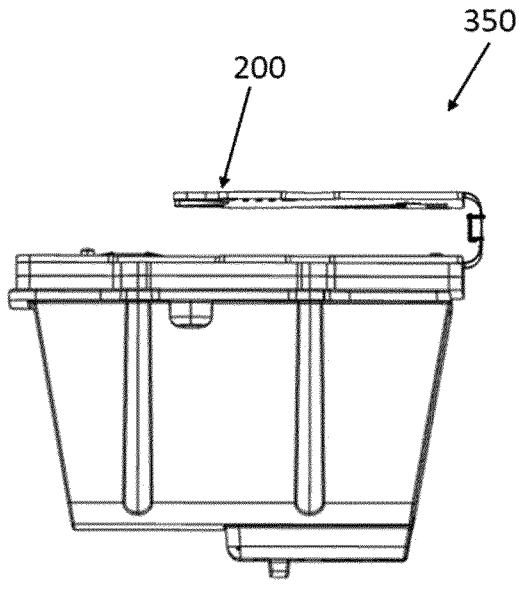

LIGHT SOURCE SUPPORT ASSEMBLY

The present invention relates to a light source support assembly or a Printed Circuit Board (PCB) assembly, and more particularly relates to a flexible PCB assembly.

A printed circuit board, or PCB, is used to mechanically support and electrically connect electronic components using conductive pathways, or traces, etched from copper sheets laminated onto a non-conductive substrate. PCBs are widely used in different industries as a technique for reducing the cable wiring between electronic components, reducing the size and weight of the device, and improving the reliability. A PCB populated with electronic components is known as a printed board assembly (PCBA). The PCBs are often populated with power components such as Light Emitting Diodes (LEDs) or any other semiconductor devices. The PCBs are often referred as a light source support.

In automotive vehicle lamps, number of high power semiconductor devices or other power components that are required to be mounted on the PCB may vary based on the application and the customer requirements. For instance, High Definition (HD) lighting of vehicle lamps require more number of high powered light sources, for example, 50 LEDs, and also requires to use related circuitry to control the light sources. Further, it is required to use additional harness and connectors to connect the PCB with other components such as a power source etc. In such cases, it may not be possible to accommodate all the components on a single PCB and may be required to increase the size of the PCB. However, the available space in vehicle lamps is limited due to optical and mechanical constraints. Further, it has been required to dissipate effectively heat generated from electronic or electric components mounted on the PCB in accordance with the increase in the number of electronic components and the use of high power semiconductor devices.

One objective of the present invention is to provide a light source support assembly or a PCB assembly which can be employed in High Definition (HD) lighting modules of vehicle lamps.

Other objective of the present invention is to provide the PCB assembly which is bendable, foldable, and able to be disposed in a lighting module of vehicle lamps in a space-saving manner.

Another objective of the present invention is to provide a PCB assembly which requires a less space compared to conventional PCBs and also less expensive compared to the conventional PCBs.

According to an embodiment of the present invention, there is provided a light source support assembly for an automotive vehicle, the light source support assembly comprises: at least two rigid Printed Circuit Board (PCB) parts comprising a first rigid PCB part and a second rigid PCB part, wherein the first rigid PCB part is mounted with a plurality of first components that are heat generated components and the second rigid PCB part is mounted with a plurality of second components that are non-heat generated components or less heat generated components compared to the plurality of first components; a flexible connecting part interconnecting the first rigid PCB part and the second rigid PCB part to one another such that longitudinal axes of the first rigid PCB part, the second rigid PCB part and the flexible connecting part are parallel to one another; and wherein the flexible connecting part includes at least one bendable portion configured to bend the light source support assembly. For instance, the flexible connecting part is configured to bend the light source support assembly in a direction perpendicular to longitudinal axes of the rigid PCB parts.

Thus, the PCB assembly of the present invention is bendable, foldable, and able to be disposed in a lighting module of vehicle lamps in a space-saving manner in a bent state of the PCB assembly. Therefore, a space saving lighting module can be obtained with the PCB assembly of the present invention. In addition, the rigid PCB parts of the PCB assembly of the present invention can be mounted with numerous components, which are generally required in high definition lighting modules. Also, the PCB assembly of the present invention is less expensive than an assembly having two separate PCBs connected by harness and connectors.

In an embodiment, the flexible connecting part allows to arrange the first rigid PCB part and the second rigid PCB part at a predetermined angle to each other. In an embodiment, the angle is between 0° and 360° or, in other words, the first or second PCB can be oriented +/−180° compared to the other PCB. As the two rigid PCB parts can be arranged at a predetermined angle to each other, desired flexibility is obtained and can withstand any degree of bending without damage. Thus, the PCB assembly of the present invention can be used for various applications.

In an embodiment, the first rigid PCB part and the second rigid PCB part includes a first side and a second side that is disposed opposite to the first side. In an embodiment, the plurality of first components are mounted on the first side of the first rigid PCB part and are selected from a group consisting of: power components such as one or more power LEDs, one or more active components, one or more passive components, a power converter, or any other semiconductor components.

In an embodiment, the light source support assembly further includes a cooling assembly operatively connected to the second side of the first rigid PCB part. Thus, according to the present invention, heat generated from the high power components can be effectively dissipated by the cooling assembly.

In an embodiment, the one or more power LEDs are directly mounted on the cooling assembly through one or more holes of the first rigid PCB part. This arrangement of the power LEDs directly on the cooling assembly further improves the heat dissipation and also less effects the components that are arranged near to the light sources.

In an embodiment, the plurality of second components are mounted on the first side of the second rigid PCB part and are selected from a group consisting of: a main connector, a network interface, and a protection circuit. In this arrangement, the components which do not generate heat when operated are arranged on a separate rigid PCB part which is different from the PCB rigid part which has all the power components. Thus, heat generated by the power components can be effectively managed by directly positioning the cooling assembly at rear side of the power components and also the components which do not generate heat or generates less amount of heat when operated are arranged at a distance from the heat generated components to prevent spreading of the heat.

In an embodiment, the first rigid PCB part, the second rigid PCB part, and the flexible connecting part are integrally formed as a single component. Hence, the rigid PCB parts and the flexible connecting part are structurally bonded without the use of additional connectors.

In an embodiment, the flexible connecting part includes at least one metallization layer, which allows establishing electrical connection between the first rigid PCB part and the second rigid PCB part.

In an embodiment, the flexible connecting part is provided without electronic components on it. This ensures to provide more degree of freedom for bending the flexible connecting part without damaging.

In an embodiment, the flexible connecting part includes a single bendable portion. The bendable portion is thinner than the first and second rigid PCB parts defining a groove produced by different thicknesses of the first and second rigid PCB parts and the bendable portion. In another embodiment, the flexible connecting part include two bendable portions and a rigid portion formed between the two bendable portions, which are thinner than the first and second rigid PCB parts. The two bendable portions defines a first groove and a second groove, and wherein the first groove is formed between the first rigid PCB part and the rigid portion, and the second groove is formed between the rigid portion and the second rigid PCB part. The time required to produce the flexible connecting part with two grooves is less compared to the time required to produce the flexible connecting part with one groove. Further, the PCB assembly having the flexible connecting part with a single groove is less expensive compared to the PCB assembly having the connecting part with two grooves.

In an embodiment, the first side of the first rigid PCB part faces the first side of the second rigid PCB part, when the light source support assembly is folded.

In an embodiment, the light source support assembly is produced from glass fiber reinforced epoxy resin material.

According to another embodiment of the present invention, there is provided a lighting module comprises: a reflector assembly, a lens, a light guide, one or more light sources and the light source support assembly as claimed in any of the preceding claims.

Thus, the present invention provides the light source support assembly which is bendable, foldable, and able to be disposed in a lighting module of vehicle lamps in a space-saving manner, while able to accommodate all the necessary components to provide high definition lighting.

To complete the description and to provide a better understanding of the invention, a set of drawings is provided. Said drawings form an integral part of the description and illustrate an embodiment of the invention, which should not be construed as restricting the scope of the invention, but only as an example of how the invention can be carried out. The drawings comprise the following characteristics.

FIG. 1a is a perspective top view of a light source support assembly in an unfolded state, according to first embodiment of the present invention.

FIG. 1b is a sectional view of a light source support assembly shown in the FIG. 1a, according to first embodiment of the present invention.

FIG. 1c is a perspective top view of a light source support assembly in a folded state, according to first embodiment of the present invention.

FIG. 2a is a perspective top view of a light source support assembly in an unfolded state, according to a second embodiment of the present invention.

FIG. 2b is a sectional view of a light source support assembly shown in the FIG. 2a, according to a second embodiment of the present invention.

FIG. 2c is a perspective top view of a light source support assembly in a folded state, according to a second embodiment of the present invention.

FIG. 3a is perspective view of a lighting module with the light source support assembly shown in the FIG. 1a, according to the first embodiment of the present invention.

FIG. 3b is perspective view of a lighting module with the light source support assembly shown in the FIG. 2a, according to the first embodiment of the present invention.

FIG. 4a is perspective top view of a lighting module with the light source support assembly shown in the FIG. 1c, according to the first embodiment of the present invention.

FIG. 4b is perspective side view of a lighting module with the light source support assembly shown in the FIG. 1c, according to the first embodiment of the present invention.

FIG. 5a is perspective top view of a lighting module with the light source support assembly shown in the FIG. 2c, according to the first embodiment of the present invention.

FIG. 5b is perspective top view of a lighting module with the light source support assembly shown in the FIG. 2c, according to the first embodiment of the present invention.

Embodiments of the present application will below be explained in details by ways of examples with reference to the accompanied drawings. Throughout the description, same or similar reference numerals represent same or similar parts. The following description of the embodiments with reference to the drawings is intended to explain the general inventive concept of the present application, instead of limiting to the present invention.

In the following detailed description, for purposes of explanation, numerous specific details are set forth in order to provide a thorough understanding of the disclosed embodiments. It will be apparent, however, that one or more embodiments may be practiced without these specific details.

Printed circuit Boards (PCBs) or Printed wiring boards are widely used in different industries as a technique for reducing the cable wiring between electronic components, reducing the size and weight of the device, and improving the reliability. PCB generally comprises a flat insulating substrate and insulating layers stacked in the thickness direction of the insulating substrate, and a plurality of electronic components can be mounted on the surface. Various types of printed circuit boards are commonly used such as single-sided PCBs, double-sided PCBs, and Multi-layer PCBs. Single sided printed circuit boards are a type of circuit board that has the conductive copper and components mounted on one side of the board and the conductive wiring connected on the other side. Double sided PCBs are very similar to single sided PCBs, except that they have two sided traces with a top and bottom layer. These boards can mount conductive copper and components on both sides of the circuit board, which allows the traces to cross over each other.

Further, multilayer PCB refers to printed circuit boards with more than three layers, usually made of copper foil and insulating material. PCBs are often embodied in the form of multilayer printed circuit boards. In the case of multilayer printed circuit boards of this kind, patterned metallization layers and insulating substrate layers are arranged alternately one above the other. Such multilayer printed circuit boards allow a greater number of active and passive components to be arranged on the printed circuit board since their electrical connection can be effected by way of inter-linking wiring on several levels. To that end, different metallization layers are connected to each other electrically by way of metalized holes or through connections. In general, a multilayer printed circuit board is rigid and cannot be bent without damaging it. It frequently happens, however, that the printed circuit board has to be adapted in terms of its embodiment and arrangement to external conditions such as e.g. space requirements. To that end it is necessary, for example, to bend the printed circuit board through a certain angle. Both through-hole electronic components and Surface Mount Components (SMD) can be soldered on either side of this type of PCB. Multilayer PCB actually uses a double-sided PCB and places a prepreg (it is a term used for strengthening fabric materials which have been permeated with a resin scheme) of insulating material between each layer and then presses it together to form the multilayer PCB. The present invention is described with respect to the multilayer PCBs, without any limitation.

A motor vehicle can be any type of land vehicle, for example an automobile (car), a motorcycle, or a truck. The vehicle can be fitted with one or more front headlamps and/or one or more rear headlamps. One or more of the front and/or rear headlights may each include one or more lighting and/or signalling devices configured to perform different lighting and/or signalling functions. These devices include one or more lighting modules. Each module includes a support (PCB), circuitry on the support, one on more light sources mounted on the support and electrically connected to the circuitry.

In one example, the lighting device comprises one or more high definition lighting modules. Without limitation, the high definition lighting modules may include a matrix beam module and a pixelated light beam module. The matrix beam module produces a matrix beam. The matrix beam may comprise a plurality of pixels in a plane. The matrix beam module includes a plurality of high power LEDs arranged in rows and columns. For example, the matrix beam module may include 50 to 100 light sources. These matrix of light sources may be operated and controlled by a control circuitry.

Further, the pixelated light beam module produces a pixelated light beam emitted by a pixelated light source. With such a light beam, the pixelated lighting device can also perform localized lighting functions, for example projecting a pattern onto the scene.

These localized lighting functions preferably require that the pixelated sources be large in order to be able to produce a beam of large aperture adapted to the entire width of the road and beyond. A pixelated light source is a light source divided into several units of individually controllable light sources. Each pixel emitted by the pixelated light source, and therefore each light source unit, may correspond to a pixel of the projected pixelated light beam. Thus, the luminous intensity of each pixel of the pixelated light source and thus the illumination of each pixel of the scene can be controlled individually. The pixelated light source may have more than 1000 pixels. The pixelated lighting module can thus project high resolution patterns. The pixelated light source may include a matrix of light source units. The matrix may include a multitude of pixels in a plane. The pixelated light source may be of the DMD (Digital Mirror Device) type where the rotation modulation of micro mirrors makes it possible to obtain a desired luminous intensity in a given direction. The pixelated light source may be of LCD type (acronym for "Liquid Crystal Displays") comprising a surface light source in front of which liquid crystals are placed. The pixelated light source may be of the laser type sending a beam of light rays to a scanning system which distributes it on the surface of a wavelength conversion device, such as a plate comprising a luminophore. The pixelated light source may be an electroluminescent source. An electroluminescent source is a solid-state lighting source which comprises at least one electroluminescent element. Examples of electroluminescent elements include the light emitting diode (LED), the organic light-emitting diode (OLED) or the polymeric light-emitting diode (PLED). (Acronym for "Polymer Light-Emitting Diode"). The pixelated light source can be electroluminescent with a monolithic semiconductor. The source may for example be a monolithic matrix of pixels. The light source can be for example a monolithic matrix of LEDs. A monolithic matrix comprises at least 50 electroluminescent elements located on the same substrate (for example on the same face of the substrate), for example more than 100, 1000 or thousands.

The matrix beam module light sources and the pixelated light sources and respective control circuitries when operated generates high amount of heat, and also requires more space to accommodate the light sources. Embodiments of the present invention are directed to solve problems related to space limitations in the high definition lighting modules, while effectively dissipating the heat generated by the light sources. Although the present invention is discussed with respect to high definition lighting modules, without limitation, the present invention can be implemented for all types of lighting and/or signalling modules which uses a printed circuit board.

A PCB populated with electronic components is a printed circuit assembly, also known as a PCB assembly (PCBA). The components mounted on the PCB varies depending on the application and its function. For example, the PCB can be mounted with different electric or electronic components such as light sources, in particular, high power Light Emitting Diodes (LEDs); power converters, for example, DC/DC power converter; passive components such as resistor, inductor, and capacitor; active components such a transistor, an integrated chip (IC); connectors; network interfaces; protection circuit; drive circuits; memory units, microprocessors or any other semiconductor components. According to the present invention, the PCB may be produced from ceramic, polyimide or flame-retardant fiberglass epoxy laminate (FR4) or FR5 material.

Throughout the description the terms "light source support assembly" and "PCB assembly" may be used interchangeably.

The PCB assembly in accordance with the present invention comprises a plurality of rigid PCB parts and flexible connecting parts provided between the rigid PCB parts arranged in a longitudinal direction. The plurality of rigid PCB parts are planar portions held in a planar shape. The flexible connecting part may be formed by means of a deep milling of the PCB at the flexible connecting part. The milling process is very well known to a person skilled in the art and hence not discussed here in detail.

According to a first embodiment of the present invention, a flexible connecting part if formed with a single groove. According to a second embodiment of the present invention, a flexible connecting part is formed with two grooves. The milling time and the cost required for formation of the flexible connecting part with two grooves is less than the milling time and cost required for formation of the flexible connecting part with the single groove. Hence, the time and cost required to produce the PCB assembly according to the second embodiment is less than the time and cost required to produce the PCB assembly according to the first embodiment.

FIG. 1a is a perspective top view of a light source support assembly in an unfolded state or an unbent state, according to first embodiment of the present invention. FIG. 1b is a sectional view of a light source support assembly shown in the FIG. 1a, according to first embodiment of the present invention. FIG. 1c is a perspective top view of a light source support assembly in a folded state or in a bent state, according to first embodiment of the present invention.

The PCB assembly 100 in unbent state or unfolded is shown in the FIG. 1a, according to a first embodiment of the present invention. As can be seen from the FIG. 1a, the PCB assembly 100 comprises two rigid PCB parts 105, 110 and which are planar portions held in a planar shape and having a first longitudinal axis 111 and a second longitudinal axis 112, respectively. A flexible connecting portion 115 having a third longitudinal axis 116 is provided to join the two rigid PCB parts 115 in a longitudinal direction such that longitudinal axes 111, 112 and 116 of the first rigid PCB part 105, the second rigid PCB part 110 and the flexible connecting part 115 are parallel to one another. Each of the rigid PCB parts 105, 110 are more rigid and not bendable, whereas the flexible connection part 115 is flexible and bendable. The flexible connecting part 115 and the two rigid PCB parts 105, 110 are formed as a single component. Each rigid PCB part 105, 110 includes a first side 120a, 120b and a second side 125a, 125b disposed opposite to the first side 120a, 120b. The flexible connecting part 115 may be formed by means of a milling process, during which the thickness of the flexible connecting portion 115 is reduced as only one of its side is formed with a metallization layer to establish electrical connection between the first rigid PCB part 105 and the second rigid PCB part 110.

In an embodiment, a plurality of first components 130, for example, heat generated components are mounted on the first rigid PCB part 105. By way of an example, and not limitation, the power components 130 may include one or more power LEDs, one or more active components, one or more passive components, a power converter, or any other semiconductor components. For the sake of explanation, the first rigid PCB part 105 mounted with the light sources and a power converter is shown in the FIG. 1a. For example, the light source is a pixelated light source to generate a pixelated light beam and the power converter is a DC/DC power converter to provide a power supply to the light sources. Further, the plurality of second components (not shown in Figures) which are different from the plurality of the first components 130 are mounted on the first side 120b of the second rigid PCB part 110 and are selected from a group consisting of: a main connector, a network interface, and a protection circuit (not shown in the Figures).

In this arrangement, the components which do not generate heat or which generates less heat when operated are arranged on the second rigid PCB part 110 which is different from the first rigid PCB part 105 which in turn mounted with all the power components 130. Thus, heat generated by the power components 130 can be effectively managed by directly positioning a cooling assembly (not shown in Figures) at rear side of the power components, and also the components which do not generate heat or generates less amount of heat when operated are arranged at a distance from the heat generated components 130 to prevent spreading of the heat.

FIG. 1b is a sectional view of a light source support assembly 100 shown in the FIG. 1a, according to first embodiment of the present invention. In the first embodiment, the flexible connecting part 100 is formed with a single groove 135 corresponding to bending portion, as shown in the FIG. 1b, i.e., the flexible connecting part includes a single bendable portion. The bendable portion is thinner than the first and second rigid PCB parts 105, 110 defining the groove produced by different thicknesses of the first and second rigid PCB parts 105, 110 and the bendable portion 135. Further, as can be seen from the FIG. 2b, rigid PCB parts 105, 110 of the PCB may be formed with different layers 135a to 135h including a solder mask, an outer layer, prepreg, metallization layer (a copper layer), inner layer, and the flexible connecting part 115 includes a metallization layer, prepreg, an outer layer and a flexible solder mask.

FIG. 1c is a perspective top view of a light source support assembly in a folded state or in bent state, according to first embodiment of the present invention. As can be seen from the FIG. 1c, the first side 120a of the first rigid PCB part 105 faces the first side 120b of the second rigid PCB part 110 in the bent state. In an embodiment, the flexible connecting part 115 allows to arrange the first rigid PCB part 105 and the second rigid PCB part 110 at a predetermined angle to each other. For example, the angle is between 0° and 360° or, in other words, the first or second PCB can be oriented +/−180° compared to the other PCB. As the two rigid PCB parts 105, 110 can be arranged at a predetermined angle to each other, desired flexibility is obtained and can withstand any degree of bending without damage. Thus, the PCB assembly 100 of the present invention can be used for various applications.

FIG. 2a is a perspective top view of a light source support assembly in an unfolded state, according to a second embodiment of the present invention. FIG. 2b is a sectional view of a light source support assembly shown in the FIG. 2a, according to a second embodiment of the present invention. FIG. 2c is a perspective top view of a light source support assembly in a folded state, according to a second embodiment of the present invention.

The PCB assembly 200 in unbent state or unfolded state is shown in the FIG. 2a, according to the second embodiment of the present invention. As can be seen from the FIG. 2a, the PCB assembly 200 comprises two rigid PCB parts 205, 210, and which are planar portions held in a planar shape. A flexible connecting portion 215 is provided to join the two rigid PCB parts in a longitudinal direction such that longitudinal axes of the first rigid PCB part 205, the second rigid PCB part 210 and the flexible connecting part 215 are parallel to one another. Each of the rigid PCB parts 205, 210 are more rigid and not bendable, whereas the flexible connection part 215 is flexible and bendable. The flexible connecting part 215 and the two rigid PCB parts 205, 210 may be formed as a single component. Each rigid PCB part 205, 210 includes a first side 220a, 220b and a second side 225a, 225b disposed opposite to the first side 220a, 220b.

According to the second embodiment of the present invention, the flexible connecting part 215 includes two bendable portions 215b, 215c and a rigid portion 215a, which is not bendable is formed between the two bendable portions 215b, 215c, which are thinner than the first and second rigid PCB parts 205, 210. The two bendable portions 205, 210 defines a first groove 235a and a second groove 235b, as shown in the FIG. 2b. The first groove 235a is formed between the first rigid PCB part 205 and the rigid portion 215a, and the second groove 235b is formed between the rigid portion 215a and the second rigid PCB part 210. The time required to produce the PCB assembly 200 having flexible connecting part 215 with two grooves 235a, 235b is less compared to the time required to produce the PCB assembly having the flexible connecting part 115 with one groove 135. Further, the PCB assembly 100 having the flexible connecting part 115 with a single groove 135 is less expensive compared to the PCB assembly 200 having the flexible connecting part 215 with two grooves 235a, 235b.

Similar to the first embodiment, in the second embodiment, a plurality of first components 230, for example, heat generated components are mounted on the first rigid PCB part 205. By way of an example, and not limitation, the power components 230 may include one or more power LEDs, one or more active components, one or more passive components, a power converter, or any other semiconductor components. For the sake of explanation, the first rigid PCB part 205 mounted with the light sources and a power converter is shown in the FIG. 2a. For example, the light source is a pixelated light source to generate a pixelated light beam and the power converter is a DC/DC power converter to provide a power supply to the light sources. Further, the plurality of second components (not shown in figures) which are different from the plurality of the first components 230 are mounted on the first side 220b of the second rigid PCB part 210 and are selected from a group consisting of: a main connector, a network interface, and a protection circuit (not shown in the Figures).

In this arrangement, the components which do not generate heat or which generates less heat when operated are arranged on the second rigid PCB part 210 which is different from the first rigid PCB part 205. Thus, heat generated by the power components 230 can be effectively managed by directly positioning a cooling assembly (not shown in figures) at rear side of the power components and also the components which do not generate heat or generates less amount of heat when operated are arranged at a distance from the heat generated components to prevent spreading of the heat.

FIG. 2b is a sectional view of a light source support assembly shown in the FIG. 2a, according to first embodiment of the present invention. In the first embodiment, the flexible connecting part 215 is formed with two grooves 235a, 235b, as shown in the FIG. 2b, i.e., the flexible connecting part 215 includes two bendable portions 215b, 215c corresponding to two grooves 235a, 235b. Further, as can be seen from the FIG. 2b, rigid PCB parts 205, 210 and a rigid part 215a between the bendable portions 215b, 215c of the PCB assembly 200 are formed with different layers including a solder mask, an outer layer, prepreg, metallization layer (a copper layer), inner layer, and the bendable portions 215, 215c of the flexible connecting part includes a metallization layer, prepreg, an outer layer and a flexible solder mask.

FIG. 2c is a perspective top view of a light source support assembly in a folded state or in bent state, according to second embodiment of the present invention. As can be seen from the FIG. 2c, the first side 220a of the first rigid PCB part 205 faces the first side 220b of the second rigid PCB part 210 in the bent state. In an embodiment, the flexible connecting part 215 allows to arrange the first rigid PCB part 205 and the second rigid PCB part 210 at a predetermined angle to each other For example, the angle is between 0° and 360°, or, in other words, the first or second PCB can be oriented +/−180° compared to the other PCB. As the two rigid PCB parts 205, 210 can be arranged at a predetermined angle to each other, desired flexibility is obtained and can withstand any degree of bending without damage.

According to another embodiment of the present invention, there is provided a lighting module comprises: a reflector assembly, a lens, a light guide, one or more light sources and the light source support assembly described in previous embodiments.

FIG. 3a is perspective view of a lighting module 300 with the light source support assembly 100 shown in the FIG. 1a, according to the first embodiment of the present invention.

FIG. 3b is perspective view of a lighting module 350 with the light source support assembly 200 shown in the FIG. 2a, according to the second embodiment of the present invention.

Further, FIG. 4a shows perspective top view of a lighting module 300 with the light source support assembly 100 is in bent state and in which the flexible connecting part 115 is formed with a single bendable portion, and the FIG. 4b shows a perspective side view of a lighting module 300 with the light source support assembly is in bent state and in which the flexible connecting part 115 is formed with a single bendable portion. FIG. 5a shows perspective top view of a lighting module 350 with the light source support assembly 200 in the bent state and in which the flexible connecting part 215 is formed with two bendable portions 215b, 215c, and the FIG. 5b shows a perspective side view of a lighting module 350 with the light source support assembly 200 in bent state and in which the flexible connecting part 215 is formed with two bendable portions 215b, 215c.

Thus, the PCB assembly 100, 200 of the present invention is bendable, foldable, and able to be disposed in a lighting module of vehicle lamps in a space-saving manner in a bent state of the PCB assembly 100, 200. Therefore, a space saving lighting module 300, 350 can be obtained with the PCB assembly 100, 200 of the present invention. In addition, the rigid PCB parts 105, 205, 110, 210 of the PCB assembly 100, 200 of the present invention can be mounted with numerous components, which are generally required in high definition lighting modules. Also, the PCB assembly 100, 200 of the present invention is less expensive than an assembly having two separate PCBs connected by harness and connectors.

The person skilled in the art realizes that the present invention by no means is limited to the preferred embodiments described above. On the contrary, many modifications and variations are possible within the scope of the appended claims. Also, the skilled person readily realizes that the different embodiments described herein may be combined freely to obtain new combinations.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantages.

The invention claimed is:

1. A light source support assembly for an automotive vehicle, the light source support assembly comprises:
   at least two rigid Printed Circuit Board (PCB) parts comprising a first rigid PCB part and a second rigid PCB part,
   wherein the first rigid PCB part is mounted with a plurality of first components that are heat generated components and the second rigid PCB part is mounted with a plurality of second components that are non-heat generated components or less heat generated components compared to the plurality of first components; and
   a flexible connecting part interconnecting the first rigid PCB part and the second rigid PCB part to one another such that longitudinal axes of the first rigid PCB part, the second rigid PCB part and the flexible connecting part are parallel to one another, wherein the flexible connecting part includes at least one bendable portion configured to bend the light source support assembly, wherein the flexible connecting part includes two bendable portions and a rigid portion formed between the two bendable portions, wherein the two bendable portions each are thinner than the first and second rigid PCB parts, and the rigid portion and at least one of the first and second PCB rigid parts are at a same height.

2. The light source support assembly as claimed in claim 1, wherein the flexible connecting part allows to arrange the first rigid PCB part and the second rigid PCB part at a predetermined angle to each other.

3. The light source support assembly as claimed in claim 2, wherein the angle is between 0° and 360°.

4. The light source support assembly as claimed in claim 2, wherein the first rigid PCB part and the second rigid PCB part includes a first side and a second side disposed opposite to the first side.

5. The light source support assembly as claimed in claim 1, wherein the first rigid PCB part and the second rigid PCB part includes a first side and a second side disposed opposite to the first side.

6. The light source support assembly as claimed in claim 5, wherein the plurality of first components are mounted on the first side of the first rigid PCB part and are selected from a group consisting of one or more power LEDs, one or more active components, one or more passive components, or a power converter.

7. The light source support assembly as claimed in claim 6, wherein the one or more power LEDs are directly mounted on the cooling assembly through one or more holes of the first rigid PCB part.

8. The light source support assembly as claimed in claim 6, wherein the light source support assembly further includes a cooling assembly operatively connected to the second side of the first rigid PCB part.

9. The light source support assembly as claimed in claim 6, wherein the one or more power LEDs are directly mounted on the cooling assembly through one or more holes of the first rigid PCB part.

10. The light source support assembly as claimed in claim 5, wherein the light source support assembly further includes a cooling assembly operatively connected to the second side of the first rigid PCB part.

11. The light source support assembly as claimed in claim 5, wherein the plurality of second components are mounted on the first side of the second rigid PCB part and are selected from a group consisting of: a main connector, a network interface, and a protection circuit.

12. The light source support assembly as claimed in claim 1, wherein the first rigid PCB part, the second rigid PCB part, and the flexible connecting part are integrally formed as a single component.

13. The light source support assembly as claimed in claim 1, wherein the flexible connecting part is provided without electronic components on it.

14. A lighting module for an automotive vehicle, the lighting module comprises: a reflector assembly, a lens, a light guide, one or more light sources and the light source support assembly as claimed in claim 1.

15. The light source support assembly as claimed in claim 1, wherein the flexible connecting part and a portion of at least one of the first and second PCB rigid parts that is at a same height as the flexible connecting part are made of same materials.

* * * * *